(12) United States Patent
Chen et al.

(10) Patent No.: US 12,062,556 B2
(45) Date of Patent: Aug. 13, 2024

(54) METHODS AND APPARATUS FOR CLEANING SEMICONDUCTOR WAFERS

(71) Applicant: ACM RESEARCH (SHANGHAI) INC., Shanghai (CN)

(72) Inventors: Fuping Chen, Shanghai (CN); Xiaoyan Zhang, Shanghai (CN); Hui Wang, Shanghai (CN)

(73) Assignee: ACM RESEARCH (SHANGHAI) INC., Shanghai (CN)

( * ) Notice: Subject to any disclaimer, the term of this patent is extended or adjusted under 35 U.S.C. 154(b) by 838 days.

(21) Appl. No.: 17/051,151

(22) PCT Filed: Apr. 27, 2018

(86) PCT No.: PCT/CN2018/084752
§ 371 (c)(1),
(2) Date: Oct. 27, 2020

(87) PCT Pub. No.: WO2019/205074
PCT Pub. Date: Oct. 31, 2019

(65) Prior Publication Data
US 2021/0233782 A1   Jul. 29, 2021

(51) Int. Cl.
*H01L 21/67* (2006.01)
*B08B 3/12* (2006.01)
(Continued)

(52) U.S. Cl.
CPC ........... *H01L 21/6715* (2013.01); *B08B 3/12* (2013.01); *H01L 21/02057* (2013.01); *H01L 21/67051* (2013.01); *H01L 21/68764* (2013.01)

(58) Field of Classification Search
CPC ........... H01L 21/6715; H01L 21/02057; H01L 21/67051; H01L 21/68764;
(Continued)

(56) References Cited

U.S. PATENT DOCUMENTS 6,431,184 B1   8/2002   Taniyama
7,011,715 B2 *  3/2006   Verhaverbeke ... H01L 21/67028
                                                      134/36
(Continued)

FOREIGN PATENT DOCUMENTS

CN   101393852 A   3/2009
CN   101604616 A   12/2009
(Continued)

*Primary Examiner* — Douglas W Owens
(74) *Attorney, Agent, or Firm* — Seed IP Law Group LLP

(57) ABSTRACT

Related to is a method for cleaning an in-process wafer. The method includes causing the in-process wafer to be rotated, causing function water to be applied to a surface of the rotated in-process wafer to generate a flowing function water film on the rotated in-process wafer, causing the surface of the in-process wafer to be cleaned by a sonic device for a first period, causing the sonic device to be lifted and/or rotation speed of the rotated in-process wafer to be accelerated to separate the sonic device from the flowing function water film, causing the function water to be applied to the surface of the rotated in-process wafer for a second period after separating the sonic device from the function water film, and causing the surface of the in-process wafer to be dried.

19 Claims, 4 Drawing Sheets

(51) Int. Cl.
*H01L 21/02* (2006.01)
*H01L 21/687* (2006.01)

(58) Field of Classification Search
CPC ......... H01L 21/02052; H01L 21/67028; H01L 21/02041; H01L 21/02082; H01L 21/67023; B08B 3/12; B01D 1/14; B01D 1/0082; B01D 1/223; F04B 13/00
See application file for complete search history.

(56) References Cited

U.S. PATENT DOCUMENTS

| | | | |
|---|---|---|---|
| 10,910,244 B2 * | 2/2021 | Wang | H01L 21/67051 |
| 11,037,804 B2 * | 6/2021 | Wang | H01L 21/67057 |
| 2003/0098040 A1 | 5/2003 | Nam et al. | |
| 2008/0230092 A1 * | 9/2008 | Ko | B08B 3/024 |
| | | | 700/266 |
| 2010/0224215 A1 | 9/2010 | Mertens et al. | |
| 2011/0041871 A1 * | 2/2011 | Fan | B08B 3/02 |
| | | | 134/1 |
| 2012/0097195 A1 * | 4/2012 | Wang | B08B 3/12 |
| | | | 134/198 |
| 2014/0137899 A1 * | 5/2014 | Peters | G03F 7/425 |
| | | | 134/26 |
| 2019/0035649 A1 | 1/2019 | Shibayama et al. | |

FOREIGN PATENT DOCUMENTS

| | | |
|---|---|---|
| CN | 101879511 A | 11/2010 |
| CN | 101927242 A | 12/2010 |
| CN | 102569036 A | 7/2012 |
| JP | 2001-87725 A | 4/2001 |
| JP | 2010-212690 A | 9/2010 |
| JP | 2016-58665 A | 4/2016 |
| JP | 2018046259 A | 3/2018 |
| KR | 20070121485 A | 12/2007 |
| KR | 10-2010-0067423 A | 6/2010 |
| KR | 20140063858 A | 5/2014 |
| TW | 201738004 A | 11/2017 |
| WO | 2002/101795 A2 | 12/2002 |
| WO | 2016/183811 A1 | 11/2016 |
| WO | 2017/096553 A1 | 6/2017 |
| WO | WO-2018053678 A1 * | 3/2018 ....... H01L 21/02068 |

* cited by examiner

METHODS AND APPARATUS FOR CLEANING SEMICONDUCTOR WAFERS

FIELD

Embodiments of the present disclosure generally relate to semiconductor device manufacturing, and more specifically, to methods and apparatuses for cleaning semiconductor wafers.

BACKGROUND

The integrated circuit manufacturing process can generally be divided into front end of line (FEOL) and back end of line (BEOL) processing. The FEOL processes are focused on fabrication of the different devices that make up the integrated circuit, whereas BEOL processes are focused on forming metal interconnects between the different devices of the integrated circuit. In the FEOL processes, shallow trench isolation structures and gate or memory stacks are typically formed. These structures are fragile due to their increasingly small dimensions and the types of materials used to form the structures. BEOL processes may also have fragile structures such as dual damascene etched openings in low-k dielectric materials or polysilicon interconnect lines. Often BEOL processing includes one or more chemical mechanical planarization (CMP) process steps, which are inherently dirty processes.

The number of photoresist cleaning or stripping steps employed in the semiconductor manufacturing process has grown greatly in the last few years. The increasing number of ion implantation steps has contributed greatly to the grown number. Current high current or high energy implant (e.g., plasma) operations are the most demanding in that they require a high degree of wafer cleanliness to be obtained while minimizing or eliminating photoresist popping, surface residues, and metal contamination while requiring substantially no substrate/junction loss or oxide loss. Likewise, the semiconductor manufacturing process will typically include one or more CMP processes that typically employ abrasive slurries and rotating pads/brushes to effect surface planarization. Defect minimization during semiconductor manufacture is of great interest to the overall success as devices are scaled to smaller dimensions. However, the semiconductor devices as well as the CMP pads/brushes are often contaminated with particles that require removal for successful and efficient device manufacture.

Because of the extraordinarily high levels of cleanliness that are generally required during the fabrication of semiconductor devices, multiple cleaning steps are typically required to remove impurities or particles from the surfaces of the substrates before subsequent processing. A typical surface preparation procedure may include etch, clean, rinse and dry steps. During a typical cleaning step, the substrates may be exposed to a cleaning solution that can include mixtures of hydrogen peroxide and ammonium hydroxide, and/or hydrochloric acid, and/or sulfuric acid, and/or hydrofluoric acid. After cleaning, the substrates are rinsed using ultra-pure water and then dried using one of several known drying processes. In some instances, the cleaning solutions may be in combination with acoustical cleaning methods, e.g., ultrasonics, megasonics, and the like.

Accordingly, it would be desirable to have a process and apparatus that is capable of removing undesired particles or residues without producing an undesired decrease or change in device performance.

SUMMARY

Disclosed herein are processes and apparatus for cleaning semiconductor wafers.

In a first aspect, a method for cleaning an in-process wafer is provided. The method comprises causing the in-process wafer to be rotated, causing function water to be applied to a surface of the rotated in-process wafer to generate a flowing function water film on the rotated in-process wafer, causing the surface of the rotated in-process wafer to be cleaned by a sonic device for a first period, causing the sonic device to be lifted and/or rotation speed of the rotated in-process wafer to be accelerated to separate the sonic device from the flowing function water film, causing the function water to be applied to the surface of the rotated in-process wafer for a second period after separating the sonic device from the function water film, and causing the surface of the in-process wafer to be dried.

In a second aspect, a cleaning apparatus is provided. The cleaning apparatus comprises a chuck holding an in-process wafer, a rotating device operable to rotate the chuck, a sonic device operable to clean a surface of the in-process wafer, at least one fluid providing device operable to provide at least one of deionized water, function water and drying gas to the surface of the in-process wafer; and a control device operable to control the chuck, the rotating device, the sonic device and the at least one fluid providing device to perform a cleaning method. The method comprises causing the in-process wafer to be rotated, causing function water to be applied to a surface of the rotated in-process wafer to generate a flowing function water film on the rotated in-process wafer, causing the surface of the rotated in-process wafer to be cleaned by a sonic device for a first period, causing the sonic device to be lifted and/or rotation speed of the rotated in-process wafer to be accelerated to separate the sonic device from the flowing function water film, causing the function water to be applied to the surface of the rotated in-process wafer for a second period after separating the sonic device from the function water film, and causing the surface of the in-process wafer to be dried.

In a third aspect, a computer-readable storage medium is provided. The computer-readable storage medium comprises instructions for causing a cleaning apparatus to perform a cleaning method. The method comprises causing the in-process wafer to be rotated, causing function water to be applied to a surface of the rotated in-process wafer to generate a flowing function water film on the rotated in-process wafer, causing the surface of the rotated in-process wafer to be cleaned by a sonic device for a first period, causing the sonic device to be lifted and/or rotation speed of the rotated in-process wafer to be accelerated to separate the sonic device from the flowing function water film, causing the function water to be applied to the surface of the rotated in-process wafer for a second period after separating the sonic device from the function water film, and causing the surface of the in-process wafer to be dried.

It is to be understood that the summary is not intended to identify key or essential features of implementations of the subject matter described herein, nor is it intended to be used to limit the scope of the subject matter described herein. Other features of the subject matter described herein will become easily comprehensible through the description below.

BRIEF DESCRIPTION OF THE DRAWINGS

The above and other objectives, features and advantages of the subject matter described herein will become more apparent through more detailed depiction of example embodiments of the subject matter described herein in conjunction with the accompanying drawings, wherein in the example embodiments of the subject matter described herein, same reference numerals usually represent same components.

DETAILED DESCRIPTION

Hereinafter, the subject matter described herein will be discussed with reference to a plurality of embodiments. It should be understood that discussion of these embodiments is to enable a person of normal skill in the art to better understand and thereby implement the subject matter described herein, not implying any limitation to the scope of the subject matter described herein.

As used herein, the phrase "include(s)" and its variants shall be interpreted as an open term meaning "including but not limited to." The phrase "based on" shall be interpreted as "at least partially based on." The phrase "an embodiment" or "one embodiment" shall be interpreted as "at least one embodiment." The phrase "another embodiment" shall be interpreted as "at least one other embodiment." The phrase "function water" may refer to solutions dissolving specific gases, such as hydrogen, oxygen, nitrogen or ozone, into water and containing a small amount of chemicals, such as ammonia. Function water may be utilized to clean semiconductor wafers. Example function water may include at least one of $FWH_2$, $FWN_2$, $FWO_2$, DIO3, FOM, SC1, DSP and TMAH, in which $FWH_2$, $FWN_2$, $FWO_2$ may refer to the solution dissolving $H_2$, $N_2$ and $O_2$, respectively. For example, $FWO_2$ refers to Function Water+$O_2$. In the disclosure, DIO3 refers to ozonated deionized water, FOM refers to ozonated deionized Water+hydrofluoric acid (HF), SC1 refers to standard cleaning chemical1-ammonium hydroxide and hydro-peroxide mixture, DSP refers to diluted sulfuric acid peroxide, and TMAH refers to tetramethylammonium hydroxide. Other definitions might also be included explicitly and implicitly in the following description.

Some values or value ranges might be described in the following. It is to be understood that these values and value ranges are only for the purpose of illustration, which may be advantageous to practice the idea of the subject matter described herein. However, depiction of these examples is not intended to limit the scope of the subject matter described herein in any manner. According to the specific application scenarios and needs, the values or value ranges may be set otherwise.

Also, some specific materials might be described in the following. It is to be understood that these materials are only for the purpose of illustration, which may be advantageous to practice the idea of the subject matter described herein. However, depiction of these examples is not intended to limit the scope of the subject matter described herein in any manner. According to the specific application scenarios and needs, the materials may be selected otherwise.

As mentioned above, semiconductor wafers may be performed various processing, such as CMP, trench etching, lithography processing and so on, causing generation of various contaminants on the surface of the semiconductor wafers. Thus, the in-process semiconductor wafers require a number of cleaning during FEOL and BEOL processing.

Figure 1:
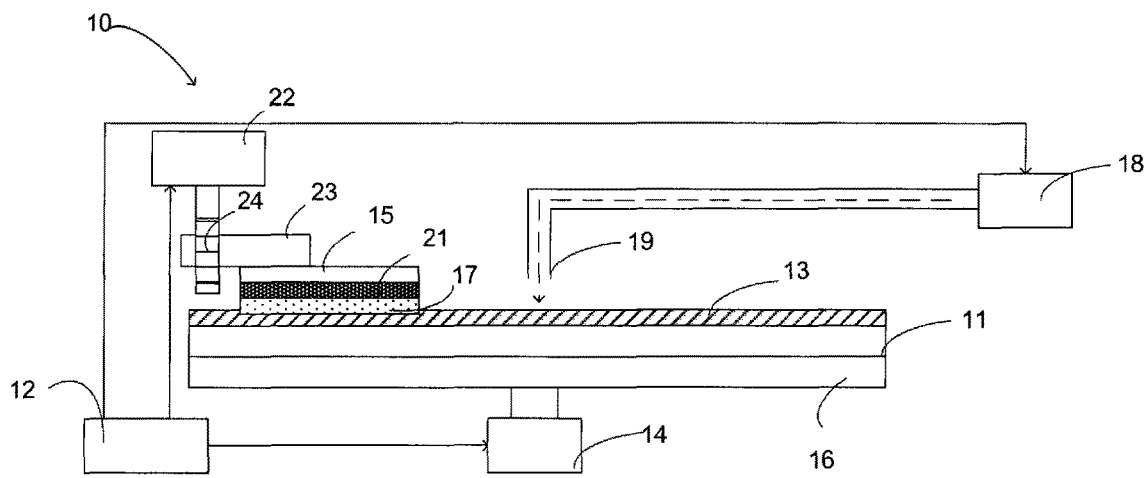
FIG. 1 illustrates an example cleaning apparatus according to an embodiment of the present disclosure.

FIG. 1 illustrates an example cleaning apparatus 10 according to an embodiment of the present disclosure. The cleaning apparatus 10 may be used to implement the processes herein. The cleaning apparatus 10 includes a chuck 16, a rotating device 14, a fluid providing device 18, a motor 22, a sonic device 15 coupled to the motor 22 via an arm 23 and a leading screw 24, and a control device 12. The chuck 16 is operable to hold in-process wafer 11. The rotating device 14 may be a motor coupled to the chuck 16, and is operable to rotate the chuck 16 such that the in-process wafer 11 may rotate accordingly. The control device 12 may be a computing device, such as a computer, having, among other things, a processor to execute instructions and a memory storing instructions. The rotation speed may be controlled by the control device 12, and varies from 1 rpm to 3000 rpm, for example.

The control device 12 controls the fluid providing device 18 such that the fluid providing device 18 may provide at least one of deionized water, function water and drying gas to the surface of the in-process wafer 11 through at least one nozzle 19. In some embodiments, the at least one nozzle 19 may include a number of nozzles to provide deionized water, function water and drying gas, respectively. Alternatively, in other embodiments, the at least one nozzle 19 may include one nozzle to provide deionized water, function water and drying gas in turn. In case that the fluid providing device 18 sprays liquid at the center on the surface of the in-process wafer 11, a flowing liquid film 13 may be formed on the surface of the in-process wafer 11. As the liquid sprays, the liquid flows from the center to the peripheral of the in-process wafer 11, and then flies away from the peripheral.

The sonic device 15 includes a piezoelectric transducer 21 acoustically coupled to resonator 17. The transducer 21 is electrically excited such that it vibrates and the resonator 17 transmits high frequency sound energy into flowing liquid film 13. The control device 12 controls the motor 22 to move up or down the sonic device 15 along the leading screw 24. The control device 12 also controls the transducer 21 and the resonator 17 to provide sonic waves or ultrasonic wave. The sonic device 15 is operable to move up and down to form a gap between the resonator 17 and the upper surface of the in-process wafer 11 based on control of the control device 12. During cleaning, the gap may be filled with one of deionized water, function water and drying gas. The gap may be variable to achieve a better cleaning effect. Details for gap setting may be found in WO2010066081A1, the content of which is incorporated herein by reference in its entirety for all purposes. In addition, the sonic device 15 may be operable to operate in various power based on control of the control device 12. It is understood that the configuration of the sonic device 15 are only example implementations, without suggesting any limitation as to the scope of the present disclosure. Any other suitable implementations for the sonic device are possible as well.

The example cleaning apparatus 10 may be in an ultra-clean chamber with a fan filter unit (FFU) and an exhausting unit (not shown), for example. The FFU and the exhausting unit may be controlled by the control device 12, or may be controlled independently. The FFU is operable to supply air at a speed between 0.1 m/s and 2 m/s, preferably between 0.2 m/s and 0.8 m/s, depending on cleanness requirement of the chamber. The exhausting unit is operable to exhaust air to set chamber exhaust pressure (EXH) between 1 pa and 1000 pa, preferably between 70 pa and 400 pa, depending on the cleanness requirement of the chamber.

Figure 2:
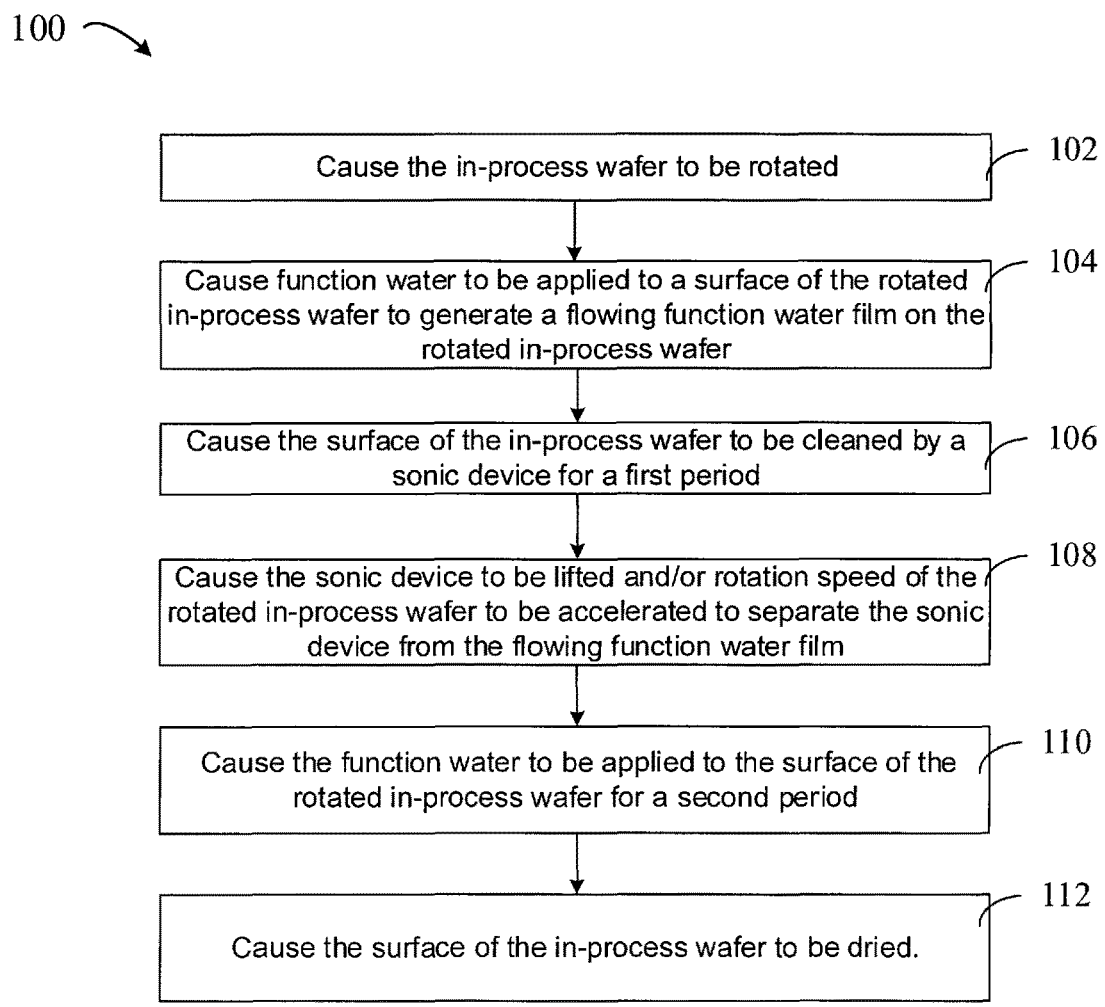
FIG. 2 illustrates an example cleaning process according to an embodiment of the present disclosure.

FIG. 2 illustrates an example cleaning process 100 according to an embodiment of the present disclosure. At block 102, the control device 12 causes the in-process wafer 11 to be rotated. In an example, the in-process wafer 11 may be rotated at a speed of 600 rpm.

At block 104, the control device 12 causes the fluid providing device 18 to apply function water to the surface of the rotated in-process wafer 11 to generate a flowing function water film on the rotated in-process wafer 11. In an example, the function water may be solutions dissolving $N_2$ into water and containing a small amount of chemicals, such as ammonia. For example, for 12-inch wafer, the function water may be provided at a flow rate between 1-3 lpm, preferably between 1.2-2 lpm, more preferably 1.8 lpm. For example, for 8-inch wafer, the function water may be provided at a flow rate between 0.5-2 lpm, preferably between 1-1.5 lpm, more preferably 1.2 lpm. The function water includes at least one of $FWN_2$, $FWH_2$, $FWO_2$, ozonated deionized water (DIO3), FOM, SC1, DSP and TMAH. The rotation speed may slow down from 600 rpm to below 50 rpm. It is to be understood that the above range and function water are only example implementations, without suggesting any limitation as to the scope of the present disclosure. Any other suitable implementations are possible as well.

At block 106, the control device 12 causes the sonic device 15 to lower down the resonator 17, such that the resonator 17 immerses into the flowing function water film, and forms a gap between the resonator 17 and the rotated in-process wafer 11. The control device 12 further causes the sonic device 15 to apply sonic wave or ultra-sonic wave to the function water film for a first period for cleaning the in-process wafer 11. As such, the surface of the in-process wafer 11 may be rinsed, and particles may be forced to separate from the surface of the in-process wafer 11. In case that the particles are removed from the surface of the in-process wafer 11 and mixed into the function water, some of the particles may be rinsed away from the rotated in-process wafer 11 with the flowing function water.

During the first period, the rotation speed may between 10 rpm and 50 rpm, preferably between 25 rpm and 35 rpm. In an example, the sonic device is configured to operate with a power between 10 W and 100 W, preferably between 20 W and 50 W. For example, for 12-inch wafer, the sonic device is configured to operate with a power between 20 W and 50 W. For example, for 8-inch wafer, the sonic device is configured to operate with a power between 10 W and 30 W. In an example, the first period is greater than 20 seconds, preferably greater than 30 seconds. It is to be understood that the above range are only example implementations, without suggesting any limitation as to the scope of the present disclosure. Any other suitable implementations are possible as well. By applying sonic/ultrasonic wave to the flowing function water film, particles adhered to the surface of the in-process wafer 11 may be forced to detach from the surface of the in-process wafer 11.

At block 108, the control device 12 causes the sonic device 15 to be lifted such that the resonator 17 is separated from the flowing function water film. Alternatively, the rotation speed may be accelerated to force the function water on the surface of the in-process wafer 11 to flow faster, such that the flowing function water film is thinned to separate from the resonator 17. In an example, rotation speed may be increased from below 50 rpm to greater than 300 rpm. In an example, both lifting of the sonic device 15 and acceleration of the rotation speed may be employed to separate the resonator 17 from the flowing function water film. It is to be understood that the above range are only example implementations, without suggesting any limitation as to the scope of the present disclosure. Any other suitable implementations are possible as well.

At block 110, the control device 12 causes the fluid providing device 18 to continue applying the function water for a second period. During the second period, the rotation speed may be between 300 rpm and 1000 rpm, preferably between 500 rpm and 700 rpm. In an example, the second period may be greater than 2 seconds, preferably greater than 4 seconds. It is to be understood that the above range are only example implementations, without suggesting any limitation as to the scope of the present disclosure. Any other suitable implementations are possible as well. For example, the second period may be between 5 seconds and 15 seconds. By continuing to apply the function water for the second period, ammonia in the function water may increase zeta potential of the surface of the particle. The ammonia is weak electrolytes that can increases pH value of the function water. As the pH value increases, the zeta potential increases to prevent particles having large negative zeta potential on their surfaces from re-adhering to the surface of the rotated in-process wafer 11, such that the particles can be removed from the surface of the rotated in-process wafer 11. It is to be understood that the ammonia are only example implementations, without suggesting any limitation as to the scope of the present disclosure. Any other suitable implementations that can increase zeta potential of the particle are possible as well. In this way, yield of semiconductor devices may be significantly improved. In addition, the rotation speed may be increased to achieve better removal of the particles.

In case the function water contains $H_2$ gas and ammonia, it is particularly advantageous to apply sonic or ultrasonic wave to achieve better surface particles removal efficiency. The sonic or ultrasonic wave may cause tiny bubbles in the flowing function water film 13. Because of the special physical chemistry of hydrogen, the $H_2$ gas is also at work. Bursts of bubbles facilitate particles separating from the surface of the in-process wafer 11. Also, the $H_2$ gas dissolved in the function water film 13 will generate more H radicals, which is beneficial for surface passivation. Thus, less chemical oxide may be generated and better surface particles removal efficiency can be achieved in this case. In addition, chemical and DIW cost can be reduced due to better surface particles removal efficiency.

At block 112, the control device 12 causes the surface of the in-process wafer 11 to be dried. In an example, the control device 12 may cause the fluid providing device 18 to provide non-reactive gas to blow the surface of the in-process wafer 11. The non-reactive gas includes at least one of $N_2$, isopropyl alcohol (IPA), and inertia gas. In addition, the control device 12 may cause the rotation speed of the in-process wafer 11 to accelerate from e.g., 600 rpm to greater than 1000 rpm, e.g., 1900 rpm. It is to be understood that the above range are only example implementations, without suggesting any limitation as to the scope of the present disclosure. Any other suitable implementations are possible as well.

It is to be understood that DIW can be applied to the surface of the in-process wafer 11 at any time. For example, DIW can be applied at the beginning of the cleaning process, at the end of the cleaning process, before applying FW, after applying FW, or any combination thereof. By applying DIW, the surface of the in-process wafer 11 may be further cleaned, or any potential FW conflict may be avoided.

Figure 3:
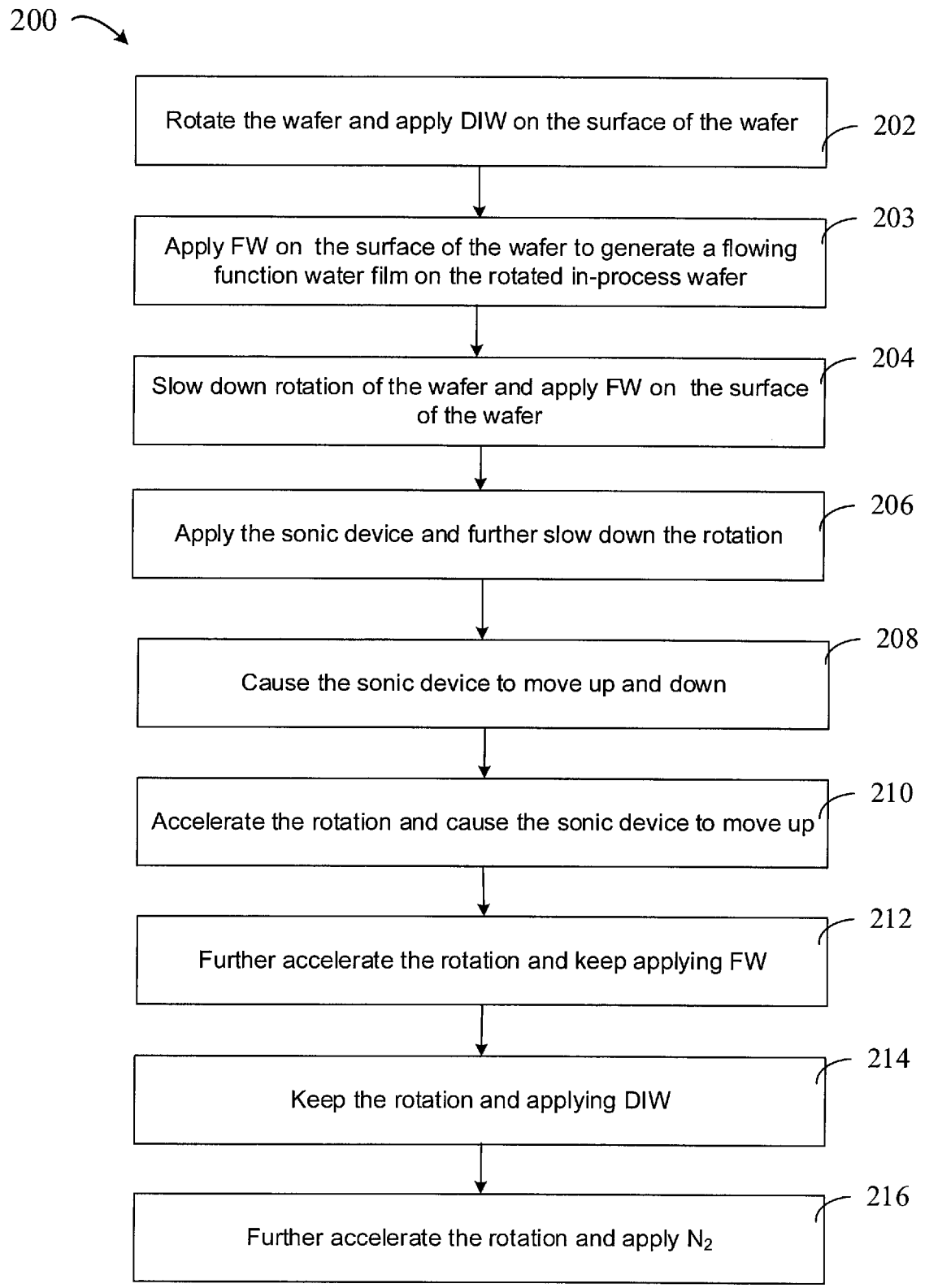
FIG. 3 illustrates an example cleaning process according to an embodiment of the present disclosure.

FIG. 3 illustrates an example cleaning process 200 according to an embodiment of the present disclosure. The cleaning process 200 may be used for flat cleaning, via cleaning and pattern cleaning. The flat cleaning includes at least one of post-CMP cleaning, implantation cleaning, post-etch cleaning, pre-metal cleaning and post-metal cleaning. Via cleaning includes at least one of pre-cleaning, post-cleaning, and post-etch cleaning. Pattern cleaning includes at least one of pre-cleaning, post-cleaning, and post-etch cleaning.

At block 202, the control device 12 causes the in-process wafer 11 to be rotated, and causes the fluid providing device 18 to apply de-ionized water (DIW) on the surface of the in-process wafer 11. In an example, the in-process wafer 11 may be rotated at a speed of 600 rpm, and the DIW is sprayed on the surface of the in-process wafer 11 at a flow rate of 1.8 lpm for 10 seconds. As such, the in-process wafer 11 may be pre-rinsed.

At block 203, the control device 12 causes the fluid providing device 18 to apply function water to the surface of the rotated in-process wafer 11 to generate a flowing function water film on the rotated in-process wafer 11.

At block 204, the control device 12 causes the rotation speed of the in-process wafer 11 to slow down and causes the fluid providing device 18 to apply function water on the surface of the in-process wafer 11 for at least one second. In an example, the function water may be solutions dissolving $N_2$ into water and containing a small amount of chemicals, such as ammonia. It is to be understood that other function water may be used according to the purpose of cleaning. The function water may be provided at a flow rate of 1.8 lpm, and the rotation speed may reduce from 600 rpm to 100 rpm.

At block 206, the control device 12 causes the sonic device 15 to move down such that the resonator 17 may immerse into the flowing function water film formed by flowing function water. This may occur independently, or may occur concurrently with applying function water to the surface of the in-process wafer 11. A gap may be thus formed between the resonator 17 and the surface of the in-process wafer 11, and is filled with flowing function water film. Sonic or ultrasonic wave may thus be applied to the flowing function water film to clean the surface of the in-process wafer 11. The control device 12 causes the rotating device 14 to slow down the rotation speed. For example, the rotation speed may reduce from 100 rpm to 30 rpm.

At block 208, while continuing to apply the function water, the control device 12 causes the sonic device 15 to move up and down with a power of 45 W for a period of 30 seconds, such that the gap may be variable during the period, as set forth in WO2010066081A1. In addition, the sonic or ultrasonic power may be variable during the period to clean the wafer efficiently.

At block 210, while continuing to apply the function water, the control device 12 causes the rotating device 14 to accelerate the rotation speed, and causes the sonic device 15 to move up for a period of at least 1 second. In an example, the rotation speed may increase from 30 rpm to 100 rpm. As such, the resonator 17 may separate from the flowing function water film. Alternatively, the rotation speed may increase from 30 rpm to 600 rpm without moving up the resonator 17 to separate the resonator 17 from the flowing function water film. In an example, the resonator 17 may be separated from the flowing function water film by the lifting of the sonic device 15 and acceleration of the rotation speed.

At block 212, while continuing to apply the function water, the control device 12 causes the rotating device 14 to further accelerate the rotation speed for a period of at least 4 seconds. It can be understood that the function water may be applied continuously during the blocks 203-212. In case that the resonator 17 has been moved up, the rotation speed may increase from 100 rpm to 600 rpm during the period. In case that the rotation speed has been increased to 600 rpm, the rotation speed may increase to greater than 600 rpm, e.g., 1000 rpm, during the period.

At block 214, the control device 12 causes the fluid providing device 18 to spray DIW to the rotated in-process wafer 11 for a period of at least 10 seconds. During the period, the DIW is sprayed at a flow rate of 1.8 lpm. At block 216, the control device 12 may cause the rotating device 14 to accelerate the rotation speed to dry the in-process wafer 11, and causes the fluid providing device 18 to spray $N_2$ at a flow rate of 5 lpm to the rotated in-process wafer 11 for a period of at least 15 seconds. The flow rate may be selected from 3 to 6 lpm. In an example, the rotation speed may increase from 600 rpm to 1900 rpm. Thus, the surface of the rotated in-process wafer 11 may be dried.

Figure 4:
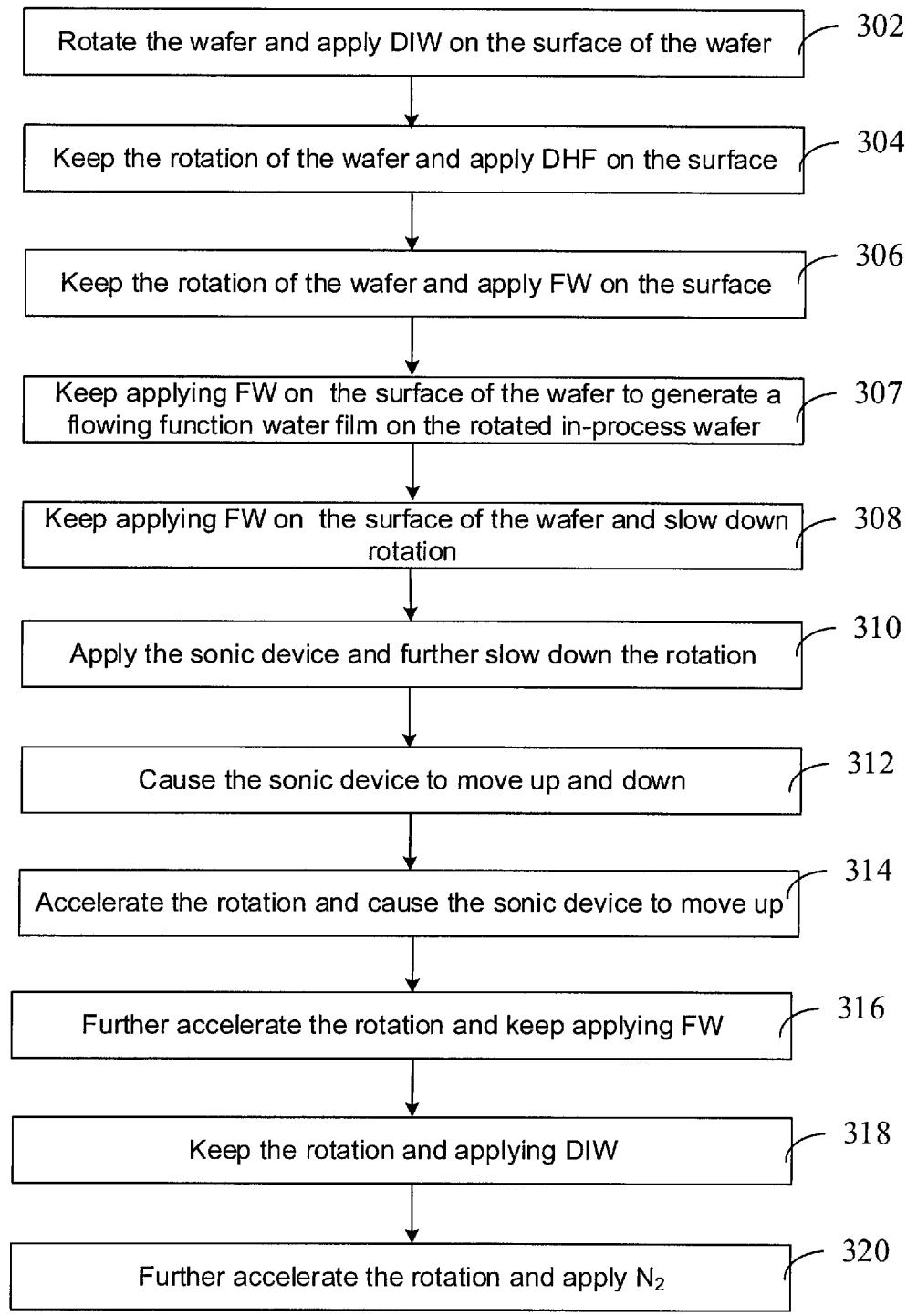
FIG. 4 illustrates an example cleaning process according to an embodiment of the present disclosure.

FIG. 4 illustrates an example cleaning process 300 according to an embodiment of the present disclosure. The cleaning process 300 may be used for flat cleaning, via cleaning and pattern cleaning. The flat cleaning includes at least one of post-CMP cleaning, implantation cleaning and post-etch cleaning. Via cleaning includes at least one of pre-cleaning, post-cleaning, and post-etch cleaning. Pattern cleaning includes at least one of pre-cleaning, post-cleaning, and post-etch cleaning.

At block 302, the control device 12 causes the in-process wafer 11 to be rotated, and causes the fluid providing device 18 to apply de-ionized water (DIW) on the surface of the in-process wafer 11. In an example, the in-process wafer 11 may be rotated at a speed of 600 rpm, and the DIW is sprayed on the surface of the in-process wafer 11 at a flow rate of 1.8 lpm for 10 seconds. As such, the in-process wafer 11 may be pre-rinsed.

At block 304, the control device 12 causes the fluid providing device 18 to apply dilute hydrofluoric (DHF) at a flow rate between 1 and 3 lpm on the surface of the rotated in-process wafer 11 for a period of at least 40 seconds, such that oxide layer on the surface of the rotated in-process wafer 11 may be etched. In an example, the flow rate of DHF may be 1.8 lpm, and concentration of DHF may be selected from 1:25 to 1:1000 in volume. In addition, the control device 12 may cause the rotating device 14 to reduce the rotation speed from 600 rpm to 450 rpm for a better etching effect.

At block 306, the control device 12 causes the fluid providing device 18 to apply function water on the surface of the in-process wafer 11 for at least 4 seconds for pre-rinsing the surface of the rotated in-process wafer 11. In an example, the function water may be solutions dissolving $H_2$ into water and containing a small amount of chemicals, such as ammonia. It is to be understood that other function water may be used according to the purpose of cleaning. The function water may be provided at a flow rate of 1.8 lpm. In addition, the control device 12 may cause the rotating device 14 to increase the rotation speed from 450 rpm to 600 rpm for a better pre-rinsing effect.

At block 307, keep applying function water on the surface of the wafer 11 to generate a flowing function water film on the rotated in-process wafer 11.

At block 308, while continuing spraying the function water on the surface of the in-process wafer 11, the control device 12 causes the rotation speed of the in-process wafer 11 to slow down for at least one second. In an example, the rotation speed may reduce from 600 rpm to 100 rpm.

At block 310, the control device 12 causes the sonic device 15 to move down such that the resonator 17 may immerse into the flowing function water film formed by flowing function water. A gap may thus be formed between the resonator 17 and the surface of the in-process wafer 11, and is filled with flowing function water film. Sonic or ultrasonic wave may thus be applied to the flowing function water film to clean the surface of the in-process wafer 11. The control device 12 causes the rotating device 14 to reduce the rotation speed. For example, the rotation speed may reduce from 100 rpm to 30 rpm.

At block 312, while continuing to apply the function water, the control device 12 causes the sonic device 15 to move up and down with a power of 45 W for a period of 30 seconds, such that the gap may be variable during the period, as set forth in WO2010066081A1. In addition, the sonic or ultrasonic power may be variable during the period to clean the wafer efficiently.

At block 314, while continuing to apply the function water, the control device 12 causes the rotating device 14 to accelerate the rotation speed, and causes the sonic device 15 to move up for a period of at least 1 second. In an example, the rotation speed may increase from 30 rpm to 100 rpm. As such, the resonator 17 may separate from the flowing function water film. Alternatively, the rotation speed may increase from 30 rpm to 600 rpm without moving up the resonator 17 to separate the resonator 17 from the flowing function water film. In an example, both lifting of the sonic device 15 and acceleration of the rotation speed may be employed to separate the resonator 17 from the flowing function water film.

At block 316, while continuing to apply the function water, the control device 12 causes the rotating device 14 to further accelerate the rotation speed for a period of at least 4 seconds. It can be understood that the function water may be applied continuously during the blocks 306-316. In case that the resonator 17 has been moved up, the rotation speed may increase from 100 rpm to 600 rpm during the period. In case that the rotation speed has been increased to 600 rpm, the rotation speed may increase to greater than 600 rpm, e.g., 1000 rpm, during the period.

At block 318, the control device 12 causes the fluid providing device 18 to spray DIW to the rotated in-process wafer 11 for a period of at least 10 seconds. During the period, the DIW is sprayed at a flow rate of 1.8 lpm. At block 320, the control device 12 may cause the rotating device 14 to accelerate the rotation speed, and causes the fluid providing device 18 to spray $N_2$ at a flow rate of 5 lpm to the rotated in-process wafer 11 for a period of at least 15 seconds. The flow rate may be selected from 3 to 6 lpm. In an example, the rotation speed may increase from 600 rpm to 1900 rpm. Thus, the surface of the rotated in-process wafer 11 may be dried.

Figure 5:
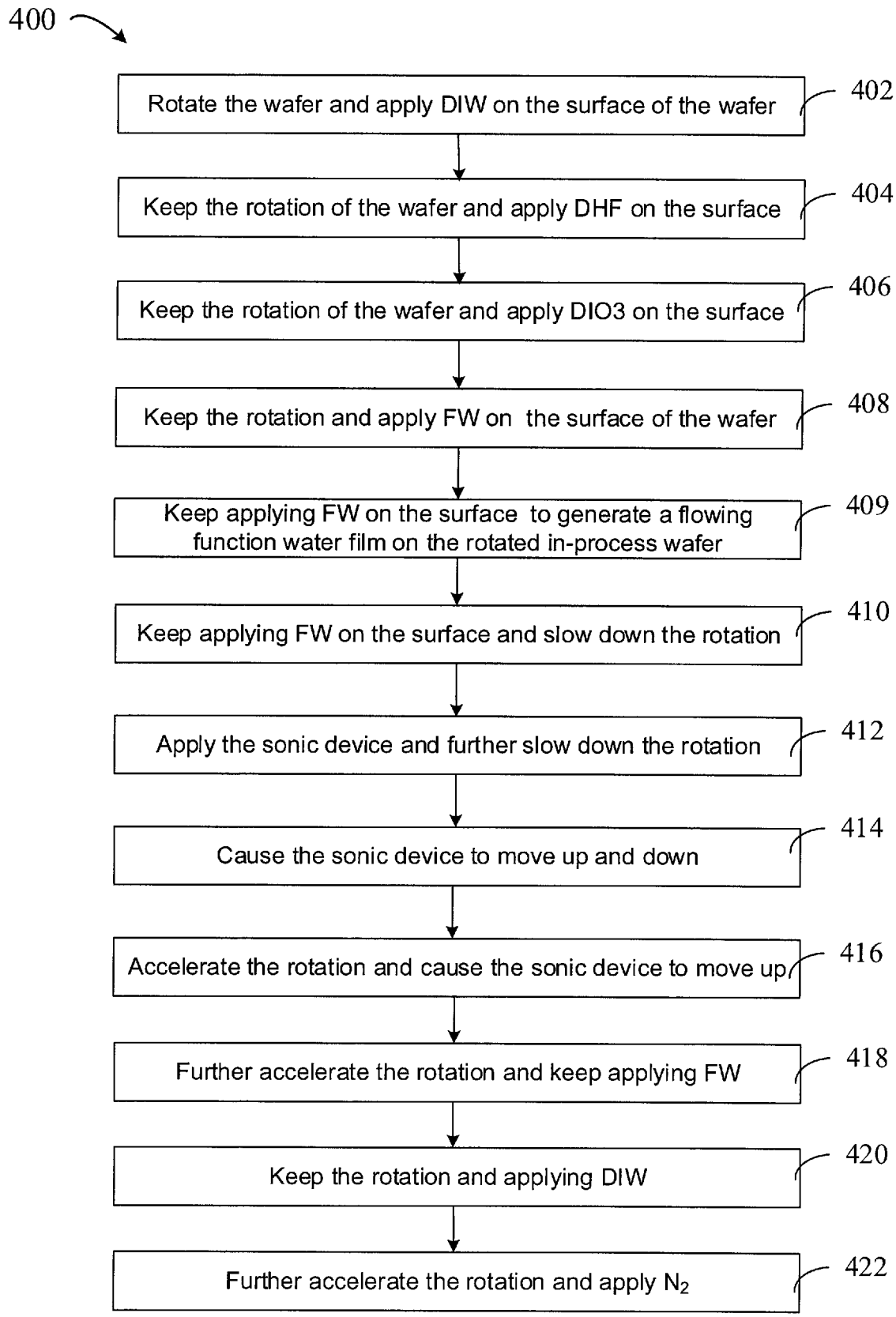
FIG. 5 illustrates an example cleaning process according to an embodiment of the present disclosure.

FIG. 5 illustrates an example cleaning process 400 according to an embodiment of the present disclosure. The cleaning process 400 may be used for flat cleaning and contact cleaning. The flat cleaning includes at least one of post-CMP cleaning, pre-strip cleaning and post-etch cleaning.

At block 402, the control device 12 causes the in-process wafer 11 to be rotated, and causes the fluid providing device 18 to apply de-ionized water (DIW) on the surface of the in-process wafer 11. In an example, the in-process wafer 11 may be rotated at a speed of 600 rpm, and the DIW is sprayed on the surface of the in-process wafer 11 at a flow rate of 1.8 lpm for 10 seconds. As such, the in-process wafer 11 may be pre-rinsed.

At block 404, the control device 12 causes the fluid providing device 18 to apply dilute hydrofluoric (DHF) at a flow rate between 1 and 3 lpm on the surface of the rotated in-process wafer 11 for a period of at least 40 seconds, such that oxide layer on the surface may be etched. In an embodiment, the flow rate of DHF may be 1.8 lpm, and concentration of DHF may be selected from 1:25 to 1:1000 in volume, for example. In addition, the control device 12 may cause the rotating device 14 to reduce the rotation speed from 600 rpm to 450 rpm for a better etching effect.

At block 406, the control device 12 causes the fluid providing device 18 to apply ozonated deionized water (DIO3) at a flow rate between 1 and 3 lpm on the surface of the rotated in-process wafer 11 for a period of at least 20 seconds, such that the surface of the wafer 11 can be post-rinsed. In an example, the flow rate of DIO3 may be 1.8 lpm, and concentration of DIO3 may be selected from 20 to 50 ppm. In addition, the control device 12 may cause the rotating device 14 to increase the rotation speed from 450 rpm to 600 rpm for a better post-rinsing effect.

At block 408, the control device 12 causes the fluid providing device 18 to apply function water on the surface of the in-process wafer 11 for at least 4 seconds for pre-rinsing the surface of the rotated in-process wafer 11. In an example, the function water may be solutions dissolving $H_2$ into water and containing a small amount of chemicals, such as ammonia. It is to be understood that other function water may be used according to the purpose of cleaning. The function water may be provided at a flow rate of 1.8 lpm.

At block 409, keep applying function water on the surface of the wafer 11 to generate a flowing function water film on the rotated in-process wafer 11.

At block 410, while continuing spraying the function water on the surface of the in-process wafer 11, the control device 12 causes the rotation speed of the in-process wafer 11 to slow down for at least one second. In an example, the rotation speed may reduce from 600 rpm to 100 rpm.

At block 412, the control device 12 causes the sonic device 15 to move down such that the resonator 17 may immerse into the flowing function water film formed by flowing function water. A gap may be thus formed between the resonator 17 and the surface of the in-process wafer 11, and is filled with flowing function water film. Sonic or ultrasonic wave may thus be applied to the flowing function water film to clean the surface of the in-process wafer 11. The control device 12 causes the rotating device 14 to reduce the rotation speed. For example, the rotation speed may reduce from 100 rpm to 30 rpm.

At block 414, while continuing to apply the function water, the control device 12 causes the sonic device 15 to move up and down with a power of 45 W for a period of 30 seconds, such that the gap may be variable during the period, as set forth in WO2010066081A1. In addition, the sonic or ultrasonic power may be variable during the period to clean the wafer efficiently.

At block 416, while continuing to apply the function water, the control device 12 causes the rotating device 14 to accelerate the rotation speed, and causes the sonic device 15 to move up for a period of at least 1 second. In an example, the rotation speed may increase from 30 rpm to 100 rpm. As such, the resonator 17 may separate from the flowing function water film. Alternatively, the rotation speed may increase from 30 rpm to 600 rpm without moving up the resonator 17 to separate the resonator 17 from the flowing function water film. In an example, both lifting of the sonic device 15 and acceleration of the rotation speed may be employed to separate the resonator 17 from the flowing function water film.

At block 418, while continuing to apply the function water, the control device 12 causes the rotating device 14 to further accelerate the rotation speed for a period of at least 4 seconds. It can be understood that the function water may be applied continuously during the blocks 408-418. In case that the resonator 17 has been moved up, the rotation speed may increase from 100 rpm to 600 rpm during the period. In case that the rotation speed has been increased to 600 rpm, the rotation speed may increase to greater than 600 rpm, e.g., 1000 rpm, during the period.

At block 420, the control device 12 causes the fluid providing device 18 to spray DIW to the rotated in-process wafer 11 for a period of at least 10 seconds. During the period, the DIW is sprayed at a flow rate of 1.8 lpm.

At block 422, the control device 12 may cause the rotating device 14 to accelerate the rotation speed, and causes the fluid providing device 18 to spray $N_2$ at a flow rate of 5 lpm to the rotated in-process wafer 11 for a period of at least 15 seconds. The flow rate may be selected from 3 to 6 lpm. In an example, the rotation speed may increase from 600 rpm to 1900 rpm. Thus, the surface of the rotated in-process wafer 11 may be dried.

It is to be understood that the above processes are only example implementations, without suggesting any limitation as to the scope of the present disclosure, and the above processes may be embodied as instructions stored on a computer-readable storage medium. The computer-readable storage medium may be the memory in the control device 12 in some implementations. When the instructions are executed, the control device 12 causes the apparatus 10 to perform the above cleaning processes. In some other implementations, the computer-readable storage medium may be positioned on devices other than the control device 12, and the control device 12 may be operable to access the instructions on the computer-readable storage medium for causing the apparatus 10 to perform the above processes.

Hereinafter, some example implementations of the present disclosure will be listed.

In some embodiments, it is provided a method for cleaning an in-process wafer. The method comprises causing the in-process wafer to be rotated; causing function water to be applied to a surface of the rotated in-process wafer to generate a flowing function water film on the rotated in-process wafer; causing the surface of the in-process wafer to be cleaned by a sonic device for a first period; causing the sonic device to be lifted and/or rotation speed of the rotated in-process wafer to be accelerated to separate the sonic device from the flowing function water film; after separating the sonic device from the function water film, causing the function water to be applied to the surface of the rotated in-process wafer for a second period; and causing the surface of the in-process wafer to be dried.

In some embodiments, causing the rotation speed of the rotated in-process wafer to be accelerated comprises causing the rotation speed of the rotated in-process wafer to be increased from below 50 rpm to greater than 300 rpm.

In some embodiments, the function water includes at least one of $FWN_2$, $FWH_2$, $FWO_2$, DIO3, FOM, SC1, DSP and TMAH.

In some embodiments, the first period is greater than 20 seconds, and the second period is greater than 2 seconds.

In some embodiments, the first period is greater than 30 seconds, and the second period is greater than 4 seconds.

In some embodiments, causing the surface of the in-process wafer to be dried comprises causing the surface of the in-process wafer to be blown with non-reactive gas while rotating the in-process wafer at a second speed.

In some embodiments, the non-reactive gas includes at least one of $N_2$, isopropyl alcohol (IPA), and inertia gas, and wherein the second speed is greater than 1000 rpm.

In some embodiments, the sonic device is configured to operate with a power between 10 W and 100 W, and the sonic device includes a resonator forming a gap between the resonator and the surface of the rotated in-process wafer.

In some embodiments, the sonic device is configured to operate with a power between 20 W and 50 W, and the gap is variable.

In some embodiments, the function water is applied at a flowing speed between 1 lpm and 3 lpm during the first and second periods.

In some embodiments, the function water is applied at a flowing speed between 1.2 lpm and 2 lpm during the first and second periods.

In some embodiments, the rotated in-process wafer is rotated at a first speed between 10 rpm and 50 rpm during the first period, and the rotated in-process wafer is rotated at a third speed between 300 rpm and 1000 rpm during the second period.

In some embodiments, the rotated in-process wafer is rotated at a first speed between 25 rpm and 35 rpm during the first period, and the rotated in-process wafer is rotated at the third speed between 500 rpm and 700 rpm during the second period.

In some embodiments, the method further comprises causing deionized water to be applied to the surface of the rotated in-process wafer for a third period prior to applying the function water to the surface of the rotated in-process wafer; and causing the deionized water to be applied to the surface of the rotated in-process wafer for a fourth period subsequent to the second period.

In some embodiments, the third period is greater than 4 seconds, and the fourth period is greater than 10 seconds; and In some embodiments, the method further comprises causing air to be supplied at a speed between 0.2 m/s and 0.8 m/s; and causing air to be exhausted to set chamber exhaust pressure (EXH) between 70 pa and 200 pa.

In some embodiments, the method further comprises causing deionized water to be applied to the surface of the rotated in-process wafer for a third period; causing dilute hydrofluoric (DHF) to be applied to the surface of the rotated in-process wafer for a fifth period to etch oxide on the surface of the rotated in-process wafer prior to applying the function water; and causing the function water to be applied to the surface of the rotated in-process wafer for a further third period prior to applying the sonic device.

In some embodiments, the method further comprises causing deionized water to be applied to the surface of the rotated in-process wafer for a third period; causing dilute hydrofluoric (DHF) to be applied to the surface of the rotated in-process wafer for a fifth period to etch oxide on the surface of the rotated in-process wafer prior to applying the function water; causing DIO3 to be applied to the surface of the rotated in-process wafer for a sixth period to rinse the surface of the rotated in-process wafer; and causing the function water to be applied to the surface of the rotated in-process wafer for a further third period prior to applying the sonic device.

In some embodiments, it is provided a cleaning apparatus. The cleaning apparatus comprises a chuck holding an in-process wafer; a rotating device operable to rotate the chuck; a sonic device operable to clean a surface of the in-process wafer; at least one fluid providing device operable to provide at least one of deionized water and function water to the surface of the in-process wafer; and a control device operable to control the chuck, the rotating device, the sonic device and the at least one fluid providing device to perform a method. The method comprises causing the in-process wafer to be rotated; causing function water to be applied to a surface of the rotated in-process wafer to generate a flowing function water film on the rotated in-process wafer; causing the surface of the in-process wafer to be cleaned by a sonic device for a first period; causing the sonic device to be lifted and/or rotation speed of the rotated in-process wafer to be accelerated to separate the sonic device from the flowing function water film; after separating the sonic device from the function water film, causing the function water to be applied to the surface of the rotated in-process wafer for a second period; and causing the surface of the in-process wafer to be dried.

In some embodiments, it is provided a computer-readable storage medium. The computer-readable storage medium comprises instructions for causing a cleaning apparatus to perform a method. The method comprises causing the in-process wafer to be rotated; causing function water to be applied to a surface of the rotated in-process wafer to generate a flowing function water film on the rotated in-process wafer; causing the surface of the in-process wafer to be cleaned by a sonic device for a first period; causing the sonic device to be lifted and/or rotation speed of the rotated in-process wafer to be accelerated to separate the sonic device from the flowing function water film; after separating the sonic device from the function water film, causing the function water to be applied to the surface of the rotated in-process wafer for a second period; and causing the surface of the in-process wafer to be dried.

Various embodiments of the subject matter described herein have been described above. The illustrations above are only for illustration without suggesting any limitations as to scope of the subject matter described herein. Without departing from the scope and spirit of various embodiments as illustrated, many modifications and changes are obvious to those skilled in the art. Selection of the terms used herein is intended to best explain the principle of respective embodiments, actual application, or improvement of technologies in the market, or enable other person of normal skill in the art to understand the embodiments disclosed herein.

What is claimed is:

1. A method for cleaning an in-process wafer, comprising:
causing the in-process wafer to be rotated;
causing function water to be applied to a surface of the rotated in-process wafer to generate a flowing function water film on the rotated in-process wafer;
causing the surface of the in-process wafer to be cleaned by a sonic device for a first period, a rotation speed of the in-process wafer at the first period being between 10 rpm and 50 rpm;
at least one of causing the sonic device to be lifted or causing a rotation speed of the rotated in-process wafer to be accelerated to separate the sonic device from the flowing function water film;
after separating the sonic device from the flowing function water film, causing the function water comprising matter for increasing zeta potential of particles to be applied to the surface of the rotated in-process wafer for a second period, a rotation speed of the in-process wafer at the second period being between 300 rpm and 1000 rpm; and
causing the surface of the in-process wafer to be dried.

2. The method of claim 1, wherein causing the rotation speed of the rotated in-process wafer to be accelerated comprises causing the rotation speed of the rotated in-process wafer to be increased from below 50 rpm to greater than 300 rpm.

3. The method of claim 1, wherein the function water includes at least one of FWN2, $FWH_2$, $FWO_2$, ozonated deionized water (DIO3), FOM, SC1, DSP and TMAH.

4. The method of claim 1, wherein the first period is greater than 20 seconds, and the second period is greater than 2 seconds.

5. The method of claim 4, wherein the first period is greater than 30 seconds, and the second period is greater than 4 seconds.

6. The method of claim 1, wherein causing the surface of the in-process wafer to be dried comprises:
causing the surface of the in-process wafer to be blown with non-reactive gas while rotating the in-process wafer at a second speed.

7. The method of claim 6, wherein the non-reactive gas includes at least one of $N_2$, isopropyl alcohol (IPA), and inert-gas, and wherein the second speed is greater than 1000 rpm.

8. The method of claim 1, wherein the sonic device is configured to operate with a power between 10 W and 100 W, and the sonic device includes a resonator forming a gap between the resonator and the surface of the rotated in-process wafer.

9. The method of claim 8, wherein the sonic device is configured to operate with a power between 20 W and 50 W, and the gap is variable.

10. The method of claim 1, wherein the function water is applied at a flowing speed between 1 lpm and 3 lpm during the first and second periods.

11. The method of claim 1, wherein the function water is applied at a flowing speed between 1.2 lpm and 2 lpm during the first and second periods.

12. The method of claim 1, wherein the rotated in-process wafer is rotated at the first speed between 25 rpm and 35 rpm during the first period, and the rotated in-process wafer is rotated at the third speed between 500 rpm and 700 rpm during the second period.

13. The method of claim 1, further comprising:
causing deionized water to be applied to the surface of the rotated in-process wafer for a third period prior to applying the function water to the surface of the rotated in-process wafer; and
causing the deionized water to be applied to the surface of the rotated in-process wafer for a fourth period subsequent to the second period.

14. The method of claim 13, wherein the third period is greater than 4 seconds, and the fourth period is greater than 10 seconds.

15. The method of claim 1, further comprising:
causing air to be supplied at a speed between 0.2 m/s and 0.8 m/s; and
causing air to be exhausted to set chamber exhaust pressure (EXH) between 70 pa and 400 pa.

16. The method of claim 1, further comprising:
causing deionized water to be applied to the surface of the rotated in-process wafer for a third period;
causing dilute hydrofluoric (DHF) to be applied to the surface of the rotated in-process wafer for a fifth period to etch oxide on the surface of the rotated in-process wafer prior to applying the function water; and causing the function water to be applied to the surface of the rotated in-process wafer for a further third period prior to applying the sonic device.

17. The method of claim 1, further comprising:

causing deionized water to be applied to the surface of the rotated in-process wafer for a third period;

causing dilute hydrofluoric (DHF) to be applied to the surface of the rotated in-process wafer for a fifth period to etch oxide on the surface of the rotated in-process wafer prior to applying the function water;

causing DIO3 to be applied to the surface of the rotated in-process wafer for a sixth period to rinse the surface of the rotated in-process wafer; and causing the function water to be applied to the surface of the rotated in-process wafer for a further third period prior to applying the sonic device.

18. A cleaning apparatus, comprising:

a chuck holding an in-process wafer;

a rotating device operable to rotate the chuck;

a sonic device operable to clean a surface of the in-process wafer;

at least one fluid providing device operable to provide at least one of deionized water, function water and drying gas to the surface of the in-process wafer; and a control device operable to control the chuck, the rotating device, the sonic device and the at least one fluid providing device to perform the method of any of claims 1-11 and 12-17.

19. A non-transitory computer-readable storage medium, comprising instructions for causing a cleaning apparatus to perform the method of any of claims 1-11 and 12-17.

* * * * *